(12) United States Patent
Palanisamy

(10) Patent No.: US 6,914,379 B2
(45) Date of Patent: Jul. 5, 2005

(54) THERMAL MANAGEMENT IN ELECTRONIC DISPLAYS

(75) Inventor: Ponnusamy Palanisamy, Lansdale, PA (US)

(73) Assignee: Sarnoff Corporation, Princeton, NJ (US)

(*) Notice: Subject to any disclaimer, the term of this patent is extended or adjusted under 35 U.S.C. 154(b) by 0 days.

(21) Appl. No.: 10/435,775

(22) Filed: May 12, 2003

(65) Prior Publication Data

US 2003/0209977 A1 Nov. 13, 2003

Related U.S. Application Data

(60) Provisional application No. 60/379,456, filed on May 10, 2002.

(51) Int. Cl.[7] .............................. H01J 1/62; H01J 63/04
(52) U.S. Cl. ....................... 313/484; 313/506; 313/512; 349/73; 349/153
(58) Field of Search ................................. 313/484, 502, 313/504, 506, 512; 315/169.1, 169.3, 169.4; 345/76, 84, 87; 349/153, 73, 74

(56) References Cited

U.S. PATENT DOCUMENTS

| | | | |
|---|---|---|---|
| 5,880,705 A | 3/1999 | Onyskevych et al. | |
| 5,929,562 A | 7/1999 | Pichler | |
| 6,252,564 B1 | 6/2001 | Albert et al. | |
| 6,370,019 B1 * | 4/2002 | Matthies et al. ............. | 361/681 |
| 6,410,415 B1 | 6/2002 | Estes et al. | |
| 6,498,592 B1 * | 12/2002 | Matthies ...................... | 345/1.1 |
| 6,624,570 B1 * | 9/2003 | Nishio et al. ................ | 313/506 |
| 6,683,665 B1 * | 1/2004 | Matthies ....................... | 349/73 |
| 2003/0011300 A1 | 1/2003 | Palanisamy et al. | |
| 2003/0011302 A1 | 1/2003 | Palanisamy | |

FOREIGN PATENT DOCUMENTS

WO   WO 99/41732   8/1999

* cited by examiner

Primary Examiner—Joseph Williams
Assistant Examiner—Kevin Quarterman
(74) Attorney, Agent, or Firm—William J. Burke

(57) ABSTRACT

A display having improved thermal management and a method for producing the display are disclosed. The display includes a pixel structure adjacent a front panel with thermo-mechanical elements extending between a back panel and the pixel structure to dissipate heat generated by the pixel structure.

20 Claims, 6 Drawing Sheets

THERMAL MANAGEMENT IN ELECTRONIC DISPLAYS

CROSS REFERENCE TO RELATED APPLICATIONS

This application is related to and claims the benefit of U.S. Provisional Application No. 60/379,456, filed May 10, 2002, for "Array Electrical Interconnections."

FIELD OF THE INVENTION

The present invention relates to the field of electronic displays and, more particularly, to thermal management of these electronic displays.

BACKGROUND OF THE INVENTION

Many presently available electronic displays employ one or more arrays of picture elements (hereinafter "pixels") to display an image. Each pixel typically includes a light emitting material that emits light when a current is passed therethrough to illuminate the pixel. The current passing through the light emitting material of an illuminated pixel and through current supply lines supplying current thereto generates heat in the electronic display.

Generally, the output characteristic of each pixel within an array is thermally sensitive. When the heat generated from illuminating the pixels within the array is not properly managed (i.e., dissipated), the array may develop localized "hot spots," which are small areas of an array that are significantly hotter than surrounding areas. These hot spots may lead to changes in the output characteristics of individual pixels or groups of pixels within the array, thereby causing different output characteristics to develop in individual pixels and groups of pixels within the array. These hotspots may also reduce the image quality of an electronic display and reduce its useful life.

Accordingly, displays with improved thermal management and methods for producing such displays are needed. The present invention fulfills this need among others.

SUMMARY OF THE INVENTION

A display in accordance with the present invention includes a front panel and a back panel spaced from the front panel to define a space therebetween. At least one pixel structure is adjacent the front panel in the space between the front and back panels and a plurality of electrical connections extend between the back panel and the at least one pixel structure. A plurality of thermo-mechanical elements extend between the back panel and the at least one pixel structure to dissipate heat from the at least one pixel structure toward the back panel. At least a portion of at least one of the thermo-mechanical elements is positioned between adjacent pixel structures of the at least one pixel structure.

DETAILED DESCRIPTION OF THE INVENTION

Figure 1:
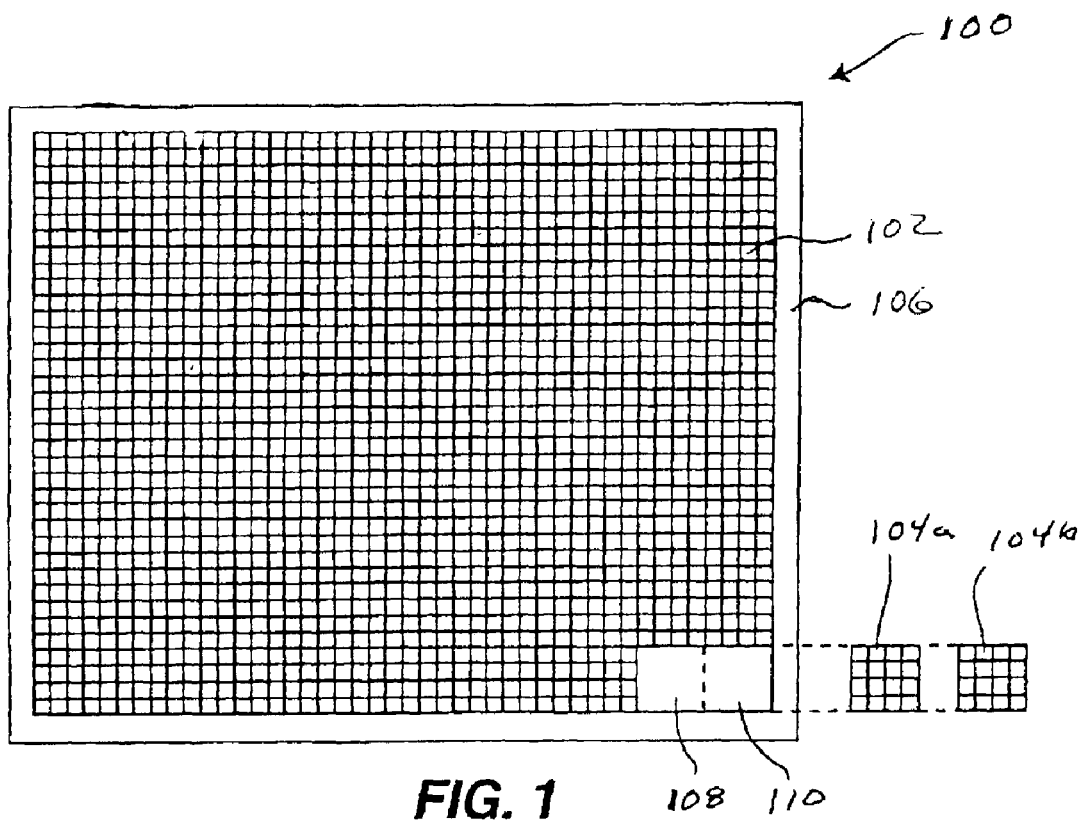
FIG. 1 is a front plan drawing of a tiled display (with two tiles removed) in accordance with the present invention.

The invention is described in terms of exemplary embodiments, which are illustrated in the drawing figures. The drawing figures are not to scale and may be exaggerated to aid in the description of the invention. Although the invention is described in terms of an organic light emitting diode (OLED) display device, it is contemplated that it may be practiced with other emissive display technologies employing elements such as electroluminescent elements, light emitting diodes, field emissive elements, plasma elements, or cathodoluminescent elements; or with reflective display technologies employing elements such as bistable, reflective cholesteric (BRC) liquid crystal elements.

FIG. 1 is a front plan view of a partially assembled exemplary display 100 according to one aspect of the present invention. The display 100 is a tiled display in which emissive or reflective elements that form pixel structures (represented by pixel 102) are built in relatively small arrays to form tiles 104. The illustrated tiles 104 each include sixteen pixels, however, each tile may contain fewer pixels or more pixels, e.g. tens, hundreds, or even thousands of pixels. The tiles 104 are then assembled into a frame 106 to produce the display 100. Alternatively, the tiles 104 may be assembled side-to-side in rows and columns without a frame. In this instance, the individual tiles may be held together by millions. The display 100 is shown in FIG. 1 with two tiles 104a and 104b missing. These tiles are inserted into the display in a first position 108 and a second position 110 to complete the display 100. Although the invention is described in terms of a tiled display that includes a plurality of tiles, those of skill in the art will recognize that the invention can be used in non-tiled displays as well.

Figure 2:
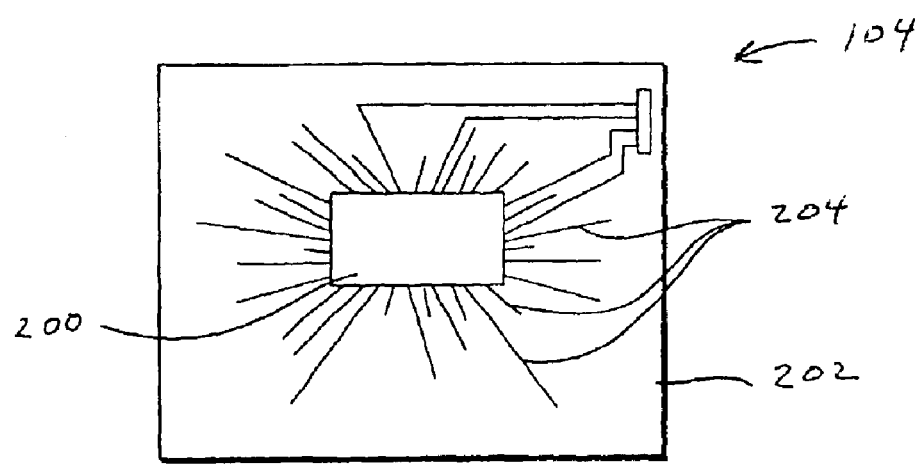
FIG. 2 is a perspective drawing of the back side of a tile suitable for use in the tiled display of FIG. 1.

FIG. 2 is a back plan view of a tile 104 suitable for use in the display 100 of FIG. 1. The tile 104 includes at least one integrated circuit 200 mounted on a circuit board 202. Conductive traces 204 coupled to vias (not shown) extend through the circuit board 202 to connect the integrated circuit 200 to the pixel structures 102 (FIG. 1) on the front of the tile 104.

Figure 3:
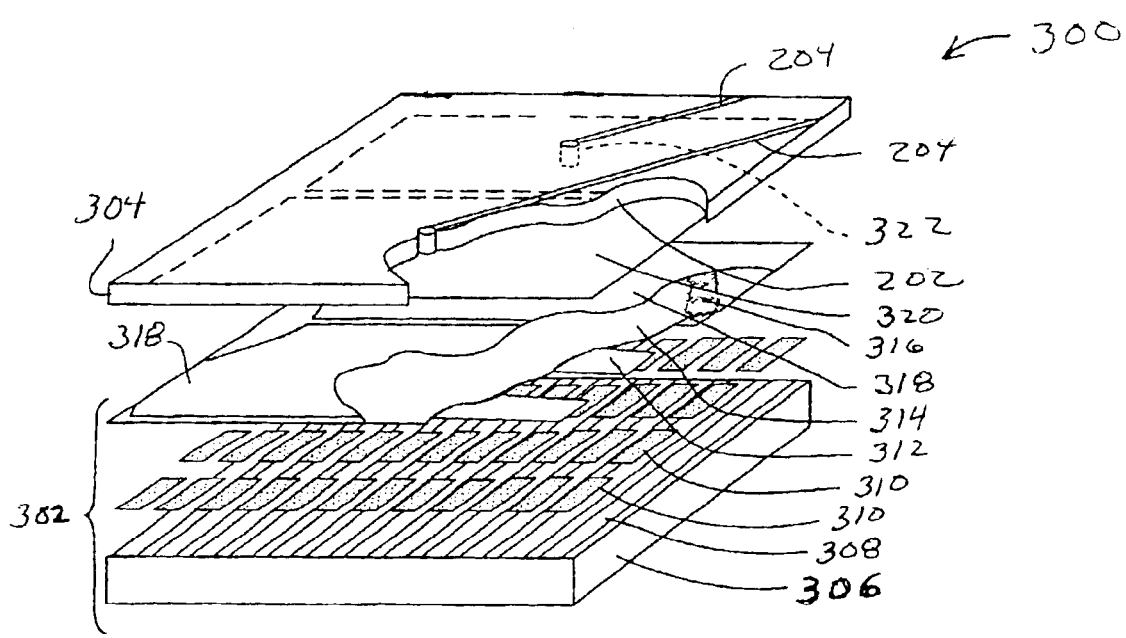
FIG. 3 is an exploded perspective drawing of a tile in accordance with the present invention.

FIG. 3 is an exploded perspective diagram that shows an exemplary display tile 300. The exemplary display tile 300 is formed in two parts: the display module 302 and the circuit module 304. In an exemplary embodiment, these two parts are formed separately and then joined to form a complete tile.

The display module 302 includes a transparent front panel 306, e.g., a float glass plate. A plurality of pixel structures are formed adjacent the front panel 306. Each pixel structure includes a column electrode 308, display material 310, and a row electrode 312. The column electrodes 308 are formed on the front panel 306. In an exemplary embodiment, the column electrodes 308 are formed by depositing thin bands of a transparent conductor, e.g., indium-tin oxide (ITO), using well known processes.

The display materials 310 are then deposited on the column electrodes 308 to define the active area of the pixel structure, which is described in further detail below. In an exemplary embodiment, the display materials 310 are red, green, and blue OLED materials that are selectively deposited on top of the column electrodes 308 to form a "color" display tile 300.

The row electrodes 312 are then formed on the display materials 310. In the illustrated embodiment, the row electrodes 312 are substantially perpendicular to the column electrodes 308 and together form a grid pattern that allows each of the active pixel areas to be addressed by specifying a column number and a row number. In an exemplary embodiment, the row electrodes 312 are formed from a polysilicon material or from a metal such as aluminum using standard deposition techniques.

An insulating layer 314 is formed on top of the row electrodes 312. The exemplary insulating layer 314 may be formed from any of a number of insulating materials. In an exemplary embodiment, the insulating layer 314 is desirably formed using low-temperature processes to protect the display materials 310. Exemplary insulating layers 314 known low-temperature inorganic materials, that can be formed using low-temperature processes. The insulating layer 314 may be applied using thick film or thin film deposition techniques. The insulating layer 314 includes a plurality of openings 316 enabling electrical connection with the row electrodes 312 or column electrodes 308 of the pixel structures and enabling thermo-mechanical connections to one or more locations within the display module 302. The formation of electrical connections and thermo-mechanical connections are described in further detail below.

On top of the insulating layer 314 are deposited a plurality of conductor traces 318. In an exemplary embodiment, the conductor traces 318 are formed using vapor deposited aluminum or a metallic ink or paste, such as silver combined with a solvent, which is deposited using thick film processes. Each of the conductor traces 318 is electrically coupled to one of the column electrodes 308 or one of the row electrodes 312, and/or thermo-mechanically connected to one or more positions within the display module 302, by vias (not shown) that extend through the openings 316 in the insulating layers 314. Via is used in the broadest sense and includes conductors that go through openings in the layer(s) and those that go around the edge of a layer(s).

Each of the exemplary conductor traces-318 makes electrical contact with only one row electrode 312 or one column electrode 308. To ensure that a good connection is made, however, each conductor trace 318 may connect to its corresponding row or column electrode 312, 308 at several locations. Because each conductor trace 318 makes electrical contact with only one row or column electrode, the number of conductor traces 318 is greater than or equal to the sum of the number of column electrodes 308 and the number of row electrodes 312 in the tile 300.

The circuit module 304 includes image processing and display driving circuitry 200 (FIG. 2), a circuit board 202, conductive traces 204, and connecting pads 320. The circuit board 202 is a back panel that is spaced from the front panel 306 to accommodate the pixel structures in a space therebetween.

Vias 322 electrically connect the conductive traces 204 to the connecting pads 320 through the circuit board 202. In an exemplary embodiment, the conductive traces 204, vias 322, and connecting pads 320 are formed using thick film deposition processes to apply a metallic ink or paste. In an alternative exemplary embodiment, the connecting pads 320 are formed from vapor-deposited aluminum. In an exemplary embodiment, each connecting pad 320 of the circuit module 304 corresponds to a conductor trace 318 of the display module 302.

The display module 302 and the circuit module 304 are combined to form the display tile 300. In an exemplary embodiment, the connecting pads 320 are electrically connected to the corresponding conductor traces 318 by applying an anisotropically conductive adhesive between the display module 302 and the circuit module 304. Alternative methods for electrically connecting the connecting pads 320 to the conductor traces 318 will be readily apparent to those of skill in the art.

Figure 4:
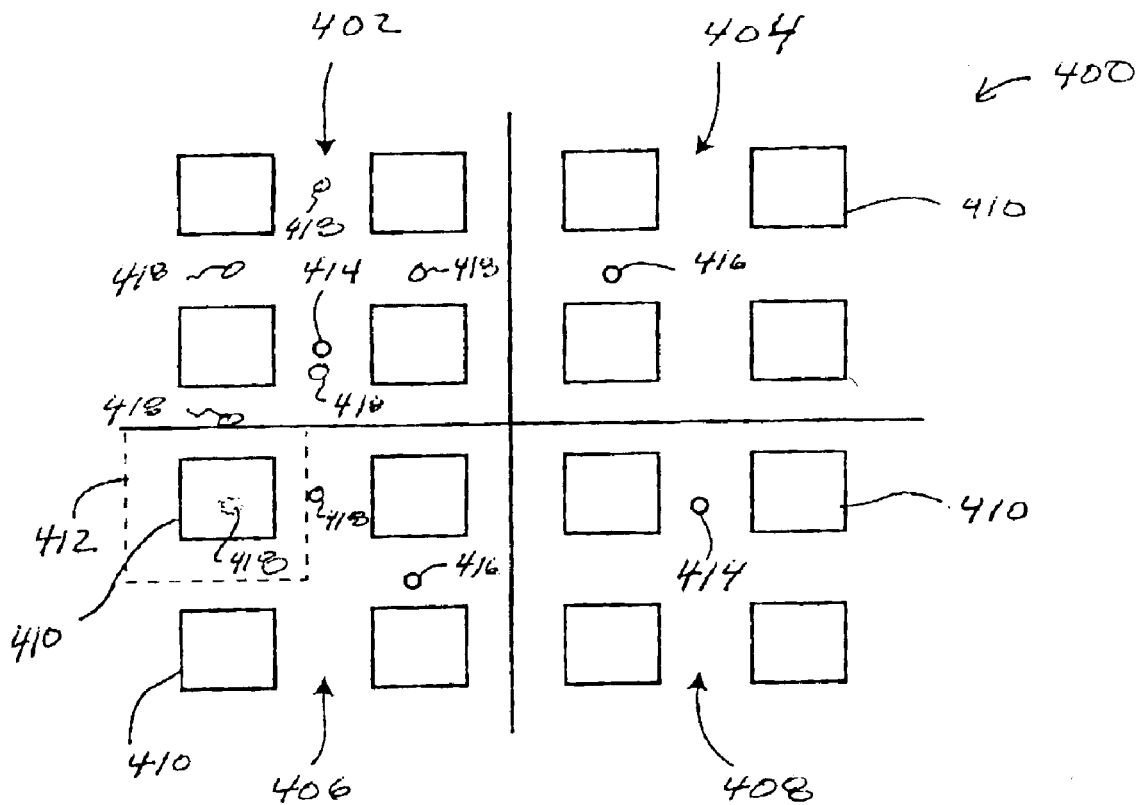
FIG. 4 is a pixel diagram of an exemplary pixel and connection layout for portions of four tiles in accordance with the present invention.

FIG. 4 shows a pixel structure layout 400 suitable for use in a display such as that shown in FIG. 1. FIG. 4 illustrates portions of 4 tiles 402, 404, 406, 408. In the layout shown in FIG. 4, active portions of the pixel structures (represented by active portions 410) are positioned within respective pixel structure regions (represented by pixel region 412). Row electrodes (see FIG. 3) and column electrodes (see FIG. 3) may be electrically coupled by electrical connections 414 and 416, respectively, to corresponding vias on the circuit module 304 (FIG. 1). In certain exemplary embodiments, the electrical connections 414 and 416 are vias formed from a conductive material such as indium-tin (InSn) solder or a silver-filled epoxy adhesive.

In an exemplary embodiment of the present invention, thermo-mechanical elements 418 are provided to thermally couple the pixel structures to the circuit module 304 (FIG. 1). The thermo-mechanical elements 418 may be positioned throughout each pixel structure and, in certain embodiments, are positioned between adjacent pixel structures within the display module 302. For example, thermo-mechanical elements 418 may be placed between each active pixel area not having an electrical connection via 414, 416; next to the electrical connections; under the active pixel area (element shown in phantom); or essentially anywhere on and in the vicinity of the display module 302 to dissipate heat from the display module 302 to the circuit module 304.

In certain exemplary embodiments, the thermo-mechanical elements 418 provide a redundant electrical connection between the row and column electrodes and the circuit module 302. In these embodiments, the thermo-mechanical elements 418 may be vias formed from the same materials as the electrical connections 414, 416, e.g., InSn solder or a silver filled epoxy adhesive. In certain other exemplary embodiments, one or more of the thermo-mechanical elements 418 are electrically non-functional. In accordance with this embodiment, the thermo-mechanical elements 418 may be separated from conductors on one or both ends of the via 418 with a passivation layer or may be formed from a dielectric material such as an epoxy filled with materials having suitable thermal conduction properties, e.g., diamond, BN, AlN, and/or SiC. The selection of suitable material for forming the thermo-mechanical elements 418 will be readily apparent to those of skill in the related arts.

Figure 5:
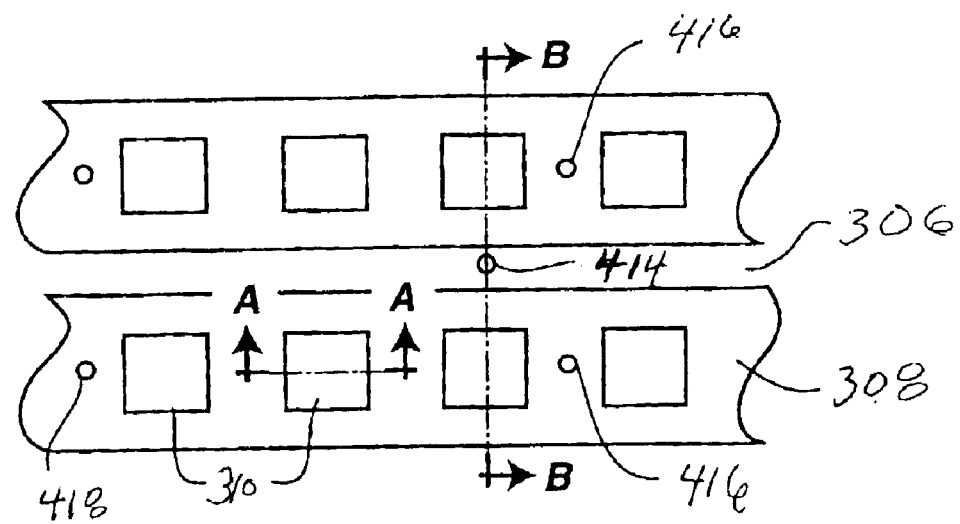
FIG. 5 is a top view of a display material formed upon a column electrode in accordance with the present invention.
Figure 5A:
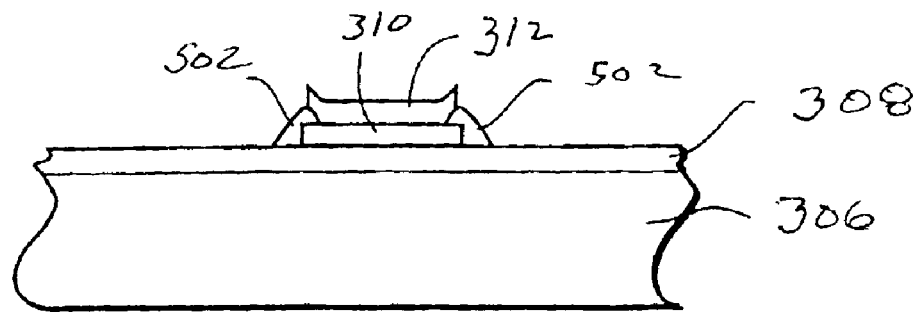
FIG. 5A is a cross-sectional view taken along line A—A of FIG. 5 depicting column and row electrodes along a column electrode.
Figure 5B:
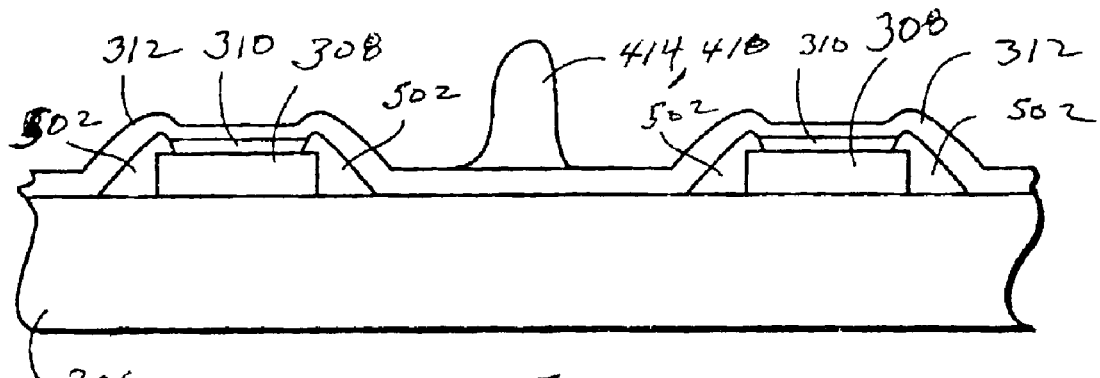
FIG. 5B is a cross-sectional view taken along line B—B of FIG. 5 depicting column and row electrodes along a row electrode.

FIG. 5 shows a view of a portion of a display module of an electronic pixel structure according to the present invention. FIGS. 5A and 5B illustrate cross-sectional views taken along lines A—A and B—B, respectively, of FIG. 5 to illustrate an exemplary pixel structure according to the present invention.

A transparent column electrode 308, e.g., ITO is formed on the front panel 306. A display material 310 formed upon the column electrode 308 defines the active portion 410 (FIG. 4) of the pixel structure. As shown in FIGS. 5A and 5B, an insulator 502 such as $SiO_2$ is then deposited on the ends of the display material 310. A row electrode 312 is then formed upon the display material 310 and the insulator 502. The insulator 502 allows the row electrode 312 to be formed wide enough to completely encapsulate the display material without shorting the row electrode 312 to the column electrode 308. Thus, the row electrode 312, the insulator 502, the column electrode 308, and possibly the front plate 306 encapsulate the display material 310. This encapsulation seals the display materials 310 to help prevent exposure of the display materials 310 to conditions including oxygen and water vapor to provide more predictable performance over a longer lifetime. In another exemplary embodiment of the present invention, the insulator 502 covers the display material 310 and the row electrode 312 contacts the display material 310 through a via (not shown) formed in the insulator 502.

FIG. 5 illustrates exemplary positions of electrical connections 414 and 416 for electrically coupling row electrodes and column electrodes, respectively, to the circuit module 304. In addition, thermo-mechanical elements 418 for thermally connecting to the pixel structure are illustrated. In FIG. 5B, an electrical connection 414 is shown as formed upon the row electrode 312 passing between adjacent pixel structures. The conductor 414 shown in FIG. 5B is illustrated as a conductive bump. In an exemplary embodiment, one or more additional electrical connections 414 and/or thermo-mechanical elements 418 are formed on the row electrode 312 in a similar manner. In certain exemplary embodiments, the thermo-mechanical elements 418 provide redundant electrical connections. In alternative embodiments, a passivation layer (not shown) is positioned on at least one end of the thermo-mechanical elements 418 or the thermo-mechanical elements 418 are formed from a dielectric material. Thus, in accordance with these embodiments, the thermo-mechanical via is electrically non-functional.

Figure 5C:
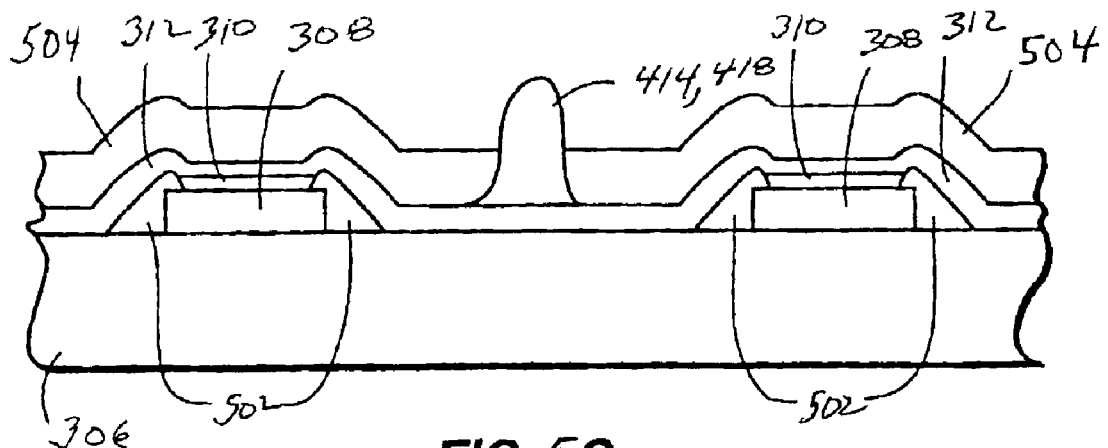
FIG. 5C is a cross-sectional view similar to the cross-sectional view of FIG. 5B with an additional insulating layer.

FIG. 5C is a cross-sectional view taken along line B—B of FIG. 5 illustrating an insulating pad 504 formed upon the row electrodes 312, column electrodes 308, and the display materials 310. In an exemplary embodiment, the electrical connections 414 and the thermo-mechanical elements 418 are formed in apertures in the insulating pad 504. In certain exemplary embodiments, electrically non-functional thermo-mechanical elements may be placed directly over or adjacent to the active elements and on top of the insulating pad 504.

In the embodiment illustrated in FIGS. 5–5C, the electrical connections 414, 416 are connected directly to the row and column electrodes 312, 308, respectively. In an alternative embodiment, one or more of the electrical connections 414, 416 may be connected to a corresponding row and/or column electrode through a conductive trace (not shown) to allow greater flexibility in the placement of the connections 414, 416. The thermo-mechanical element 418 is illustrated as connected directly to the row and/or column electrodes 312/308. In alternative exemplary embodiments, the thermo-mechanical elements 418 may be connected to various other locations within the pixel structure to dissipate heat formed in that structure. In certain exemplary embodiments, one or more of the thermo-mechanical elements 418 may be connected to row or column electrodes and/or various other locations within the pixel structure through conductive traces (not shown) to allow greater flexibility in the placement of the elements 418. The formation of a suitable conductive trace will be readily apparent to those of skill in the art.

Figure 6A:
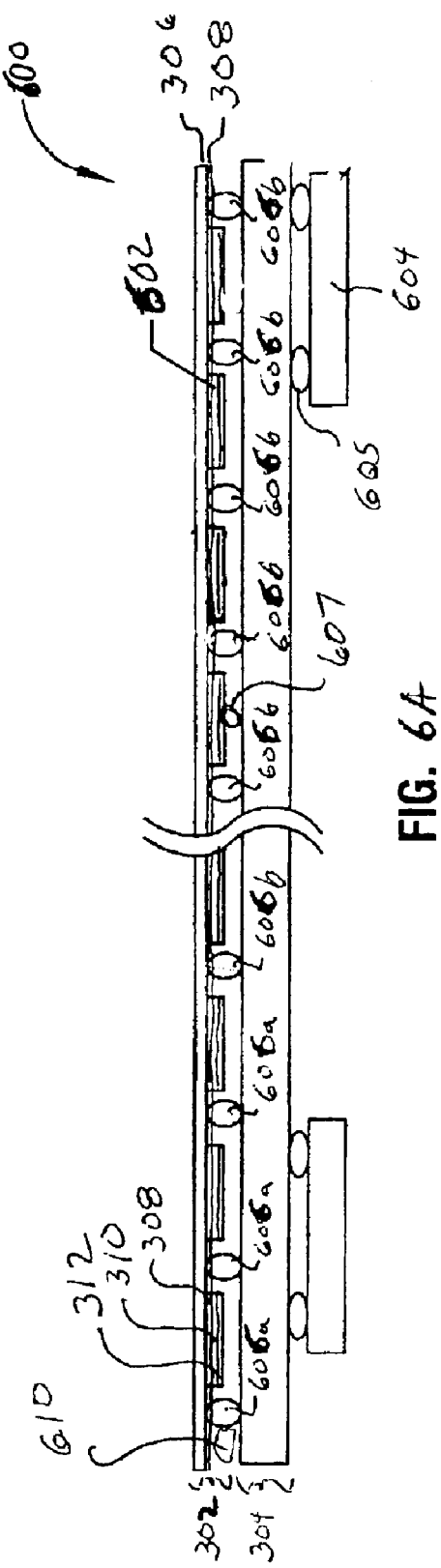
FIG. 6A is a cross-sectional view of an assembled tile along a column electrode in accordance with the present invention.
Figure 6B:
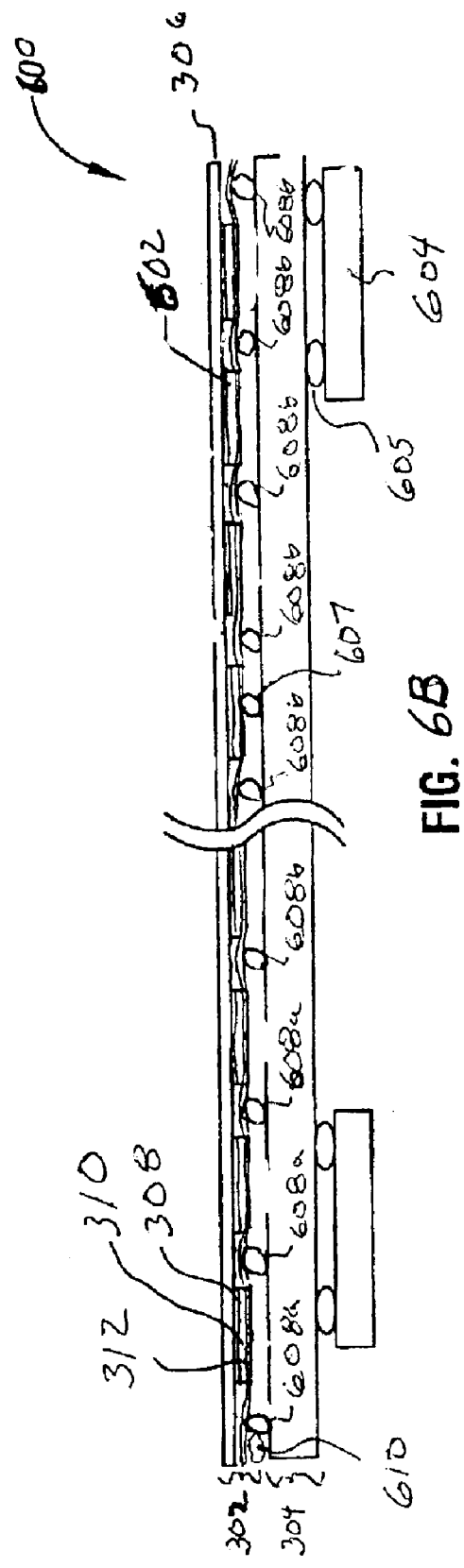
FIG. 6B is a cross-sectional view of an assembled tile along a row electrode in accordance with the present invention.

FIGS. 6A and 6B are cross-sectional views of an assembled electronic display tile 600 viewed, respectively, along a column electrode 308 and along a row electrode 312 in accordance with the present invention. The tile 600 includes a display module 302 and a circuit module 304, each comprised of multiple layers. The display module 302 includes a front panel 306 and a pixel structure (represented by pixel structure 602) adjacent the front panel 306. Each pixel structure includes a column electrode 308, a display material 310, and a row electrode 312. The circuit module 304 is a back panel positioned substantially parallel to the front panel 306. The circuit module 304 is spaced from the front panel 306 to define a space therebetween in which the pixel structure 602 is formed. Integrated circuits (represented by integrated circuit 604) are positioned upon the circuit module 304 on a side of the circuit module opposite the display module. The integrated circuit 604 is connected to the circuit module 304 in a conventional manner, e.g., with solder 605. Many tile components depicted in FIG. 3 are omitted to facilitate description of the present invention, e.g., circuit module vias 322, circuit module conductive traces 204, insulating layers 314, conductor traces 318, and connecting pads 320.

FIG. 6A illustrates a plurality of connections 606 that extend from the back panel 304 toward the front panel 306. One or more of the connection 606 are electrical connections, e.g., connections 606a. The electrical connections 606a extend between the circuit module 304 and the pixel structure 602. Specifically, the electrical connections 606a extend from the circuit module 304 to a column electrode 308 of the pixel structure 602. In addition, one or more of the connections are thermo-mechanical elements, e.g., connections 606b, that dissipate heat generated in the pixel structure 602 toward the circuit module 304. In certain exemplary embodiments, the thermo-mechanical elements 606b also provide redundant electrical connections.

In an exemplary embodiment, the thermo-mechanical elements 606b have a larger cross-sectional area than the electrical connections 606a to improve the thermal transfer capabilities of the thermo-mechanical elements. In certain exemplary embodiments, the thermo-mechanical elements 606b are sized to maximize thermal transfer capabilities without adversely affecting the operation of the display. Although the thermo-mechanical elements 606b in FIG. 6A are shown as extending from the circuit module 304 to the column electrode 308 near the front panel 306, the thermo-mechanical elements 606b may extend to essentially any depth and may be positioned at essentially any location on the circuit module 304. Those of skill in the art will recognize that the connections 606 may include conductor traces 318 and connecting pads 320 (FIG. 3) present between the circuit module 304 and the depth to which the connection 606 extends.

FIG. 6B illustrates a plurality of connections 608 that extend from the back panel 304 toward the front panel 306. One or more of the connection 608 are electrical connections, e.g., connections 608a. The electrical connections 608a extend between the circuit module 304 and the pixel structure 602. Specifically, the electrical connections 608a extend from the circuit module 304 to a row electrode 312 of the pixel structure 602. In addition, one or more of the connections are thermo-mechanical elements, e.g., connections 608b, that dissipate heat generated in the pixel structure 602 toward the circuit module 304. In certain exemplary embodiments, the thermo-mechanical elements 606b also provide a redundant electrical connection.

Although the thermo-mechanical elements 608b in FIG. 6B are shown as extending from the circuit module 304 to the row electrode 312 near the front panel 306, the thermo-mechanical elements 608b may extend to essentially any depth and may be positioned at essentially any location on the circuit module 304. For example, a thermo-mechanical element 607 may be positioned directly under a pixel structure. Those of skill in the art will recognize that the connections 608 may include conductor traces 318 and connecting pads 320 (FIG. 3) present between the circuit module 304 and the depth to which the connection 608 extends.

Referring to FIGS. 6A and 6B, in certain exemplary embodiments, an underfill encapsulant 610 encapsulates the area surrounding the components in the space defined by the circuit module 304 and the front panel 306. In an exemplary embodiment, the underfill encapsulant 610 is selected based on its heat dissipation properties. When positioned within the space defined by the circuit module 304 and the front panel 306, the underfill encapsulant 610 dissipates heat generated by the pixel structure to the circuit module 304. In certain exemplary embodiments, the underfill encapsulant is an alumina filled epoxy such as EPO-TEK H77 supplied by Epoxy Technoloy, Inc. of Billerica, Mass., USA. In certain other exemplary embodiments, the underfill encapsulant includes a filler material including diamond, BN, AlN, BeO and/or SiC. In certain other exemplary embodiments, the filler material includes small concentrations of highly conductive metal particles such as Al and Cu by themselves and in combination with non-metallic fillers.

In certain exemplary embodiments, the circuit module 304 includes at least one layer selected based on its heat dispersion properties. In an exemplary embodiment, the at least one layer dissipates at least the heat received from the pixel structure 602 at the circuit module 304 via the thermo-mechanical elements 606b, 608b. In certain exemplary embodiments, the at least one layer dissipates heat received from the pixel structure 602 at the circuit module 304 via the electrical connections 606a, 608a and/or the underfill encapsulant 610 as well. In an exemplary embodiment, the at least one layer is formed from a material selected from alumina or aluminum nitride.

In certain exemplary embodiments, reflections from the row electrodes 312 and the connections 606, 608 are minimized by minimizing their surface area or by coating the "viewer side" of these components black. The column electrodes 308, which in an exemplary embodiment are transparent, are not an issue since they reflect only a small amount of light. Coating the viewer side of the row electrodes 312 and the connections 606, 608 black can be accomplished by first depositing a conductive black coating (e.g. carbon black) in all areas where viewable metal electrodes or connections will be later deposited. In certain embodiments, the shape of the connections may be such that reflections are minimized, e.g, having an oval cross-section with the widest portion perpendicular to the nearest active pixel area 410 (FIG. 4). Various other techniques and shapes for minimizing reflections will be readily apparent to those of skill in the art and are considered within the scope of the present invention.

In certain exemplary embodiments, the connections 606, 608 are designed to reflect light from the display material 310 toward the viewer side of the display. In accordance with this embodiment, stray light (i.e., light emitted from the display material in a direction that is not viewable on the display side) is reflected toward the display side to increase the amount of visible light emitted by the display material. In this manner, the connections 606, 608 contribute to the efficiency of the pixel structure. Accordingly, displays with increased light output or displays with similar light output emitted from smaller sized display materials are achievable. In addition, reflecting the light toward the viewer side reduces the amount of light absorbed by the pixel structure, thereby preventing this stray light from generating heat within the pixel structure.

Although the invention is illustrated and described herein with reference to specific embodiments, the invention is not intended to be limited to the details shown. Rather, various modifications may be made in the details within the scope and range of equivalents of the claims and without departing from the invention.

What is claimed:

1. A display comprising:
   a front panel;
   a back panel spaced from the front panel, the front and back panels defining a space therebetween;
   at least one pixel structure adjacent the front panel in the space between the front and back panels;
   a plurality of electrical connections extending between the back panel and the at least one pixel structure; and
   a plurality of thermo-mechanical elements extending between the back panel and the at least one pixel structure to dissipate heat from the at least one pixel structure toward the back panel, wherein at least one of the plurality of thermo-mechanical elements is positioned between adjacent pixel structures of the at least one pixel structure.

2. The display of claim 1, wherein the plurality of thermo-mechanical elements are separate from the plurality of electrical connections.

3. The display of claim 1, wherein the plurality of thermo-mechanical elements comprise a material selected from a group consisting of InSn solder and silver-filled epoxy adhesive.

4. The display of claim 1, wherein the plurality of electrical connections are formed from materials used to form the plurality of thermo-mechanical elements.

5. The display of claim 1, wherein at least one of the plurality of thermo-mechanical elements is larger than one or more of the plurality of electrical connections.

6. The display of claim 1, wherein the back panel comprises a thermally conductive material for dissipating at least the heat received at the back panel via the plurality of thermo-mechanical elements.

7. The display of claim 1, wherein the back panel is formed from a material selected from a group consisting of alumina and aluminum nitride.

8. The display of claim 1, further comprising:
   an underfill encapsulant filling the space between the front and back panels to further dissipate heat from the at least one pixel structure toward the back panel.

9. The display of claim 8, wherein the underfill encapsulant is an alumina filled epoxy.

10. The display of claim 8, wherein the underfill encapsulant includes a filler selected from a group consisting of diamond, BN, AlN, BeO, and SiC.

11. The display of claim 1, wherein the at least one pixel structure comprises a display material selected from a group consisting of organic light emitting diodes (OLED), light emitting diodes, field emissive elements, plasma elements, cathodoluminescent elements, end bistable, reflective cholesteric (BRC) liquid crystal elements.

12. An electronic display comprising:
    a front panel;
    a back panel spaced from the front panel, the front and back panels defining a space therebetween;
    at least one pixel structure having a top surface adjacent the front panel and a bottom surface, each of the at least one pixel structure having a first electrode on the top surface and a second electrode on the bottom surface;
    a first electrical connection via extending between the back panel and the first electrode of one of the at least one pixel structure;
    a second electrical connection via extending between the back panel and the second electrode of the one of the at least one pixel structure; and
    at least one thermo-mechanical via extending between the back panel and the one of the at least one pixel structure to dissipate heat from the one of the at least one pixel structure to the back panel, wherein the at least one thermo-mechanical via is positioned between adjacent pixel structures of the at least one pixel structure.

13. The display of claim 12, wherein the at least one thermo-mechanical via is electrically isolated from the first and second electrodes.

14. The display of claim 12, wherein the at least one pixel structure comprises a display material selected from a group consisting of organic light emitting diodes (OLED), light emitting diodes, field emissive elements, plasma elements, cathodoluminescent elements, and bistable, reflective cholesteric (BRC) liquid crystal elements.

15. The display of claim 12, wherein the at least one thermo-mechanical via is formed from a material selected from a group consisting of InSn solder and silver-filled epoxy adhesive.

16. The display of claim 12, wherein the back panel comprises a thermally conductive material for dissipating at least the heat received at the back panel via the at least one thermo-mechanical via.

17. The display of claim 12, wherein the back panel is formed from a material selected from a group consisting of alumina and aluminum nitride.

18. The display of claim 12, further comprising:
    an underfill encapsulant filling the space between the front and back panels to further dissipate heat from the at least one pixel structure toward the back panel.

19. The display of claim 18, wherein the underfill encapsulant is an alumina filled epoxy.

20. The display of claim 18, wherein the underfill encapsulant includes a filler selected from a group consisting of diamond, BN, AlN, BeO, and SiC.

* * * * *